US011688804B2

(12) United States Patent
Chiu et al.

(10) Patent No.: US 11,688,804 B2
(45) Date of Patent: Jun. 27, 2023

(54) SEMICONDUCTOR DEVICE WITH RING-SHAPED DOPED REGION AND MANUFACTURING METHOD THEREOF

(71) Applicant: Taiwan Semiconductor Manufacturing Company, Ltd., Hsinchu (TW)

(72) Inventors: Yi-Cheng Chiu, New Taipei (TW); Tien-Sheng Lin, Taoyuan (TW); Sheng-Fu Hsu, Hsinchu (TW); Chen-Yi Lee, Keelung (TW); Chiu-Hua Chung, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 71 days.

(21) Appl. No.: 17/192,862

(22) Filed: Mar. 4, 2021

(65) Prior Publication Data

US 2022/0069123 A1 Mar. 3, 2022

Related U.S. Application Data

(60) Provisional application No. 63/071,379, filed on Aug. 28, 2020.

(51) Int. Cl.
| | |
|---|---|
| *H01L 29/40* | (2006.01) |
| *H01L 29/78* | (2006.01) |
| *H01L 29/06* | (2006.01) |
| *H01L 29/417* | (2006.01) |
| *H01L 29/66* | (2006.01) |

(52) U.S. Cl.
CPC ...... *H01L 29/7816* (2013.01); *H01L 29/0653* (2013.01); *H01L 29/0692* (2013.01); *H01L 29/402* (2013.01); *H01L 29/41758* (2013.01); *H01L 29/66681* (2013.01)

(58) Field of Classification Search
CPC .............. H01L 29/0692; H01L 29/402; H01L 29/0653; H01L 29/41758; H01L 29/1095; H01L 29/0619; H01L 29/7817; H01L 27/092; H01L 21/823814; H01L 21/823892; H01L 27/0928; H01L 29/66681–66704; H01L 29/7816–7826
See application file for complete search history.

(56) References Cited

U.S. PATENT DOCUMENTS

| | | | | |
|---|---|---|---|---|
| 2018/0151730 | A1* | 5/2018 | Ma | H01L 29/167 |
| 2020/0152623 | A1* | 5/2020 | Kocon | H01L 27/0688 |
| 2022/0262927 | A1* | 8/2022 | Shin | H01L 29/66674 |

* cited by examiner

*Primary Examiner* — Shahed Ahmed
(74) *Attorney, Agent, or Firm* — JCIPRNET

(57) ABSTRACT

A semiconductor device and a manufacturing method thereof are provided. The semiconductor device has a source region and a drain region in a substrate, a gate structure and a metallic line. The source region surrounds the drain region in the substrate. The gate structure is disposed on the substrate, and disposed between the source region and the drain region. The gate structure surrounds the drain region. The metallic line is located above the source and drain regions and the gate structure and electrically connected to the drain region or the source region. The source region includes a doped region having a break region located between two opposite ends of the doped region. The metallic line extends from the drain region, across the gate structure and across the break region and beyond the source region.

20 Claims, 18 Drawing Sheets

US 11,688,804 B2

SEMICONDUCTOR DEVICE WITH RING-SHAPED DOPED REGION AND MANUFACTURING METHOD THEREOF

CROSS-REFERENCE TO RELATED APPLICATION

This application claims the priority benefit of U.S. provisional application Ser. No. 63/071,379, filed on Aug. 28, 2020. The entirety of the above-mentioned patent application is hereby incorporated by reference herein and made a part of this specification.

BACKGROUND

Metal-oxide-semiconductor (MOS) field effect transistors are important semiconductor devices applied for very-large-integrated-circuits such as microprocessors. MOSFETs are devices composed of four terminals commonly identified as the source, bulk, gate and drain, where the voltage on the gate controls the current flowing from the drain to the source.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
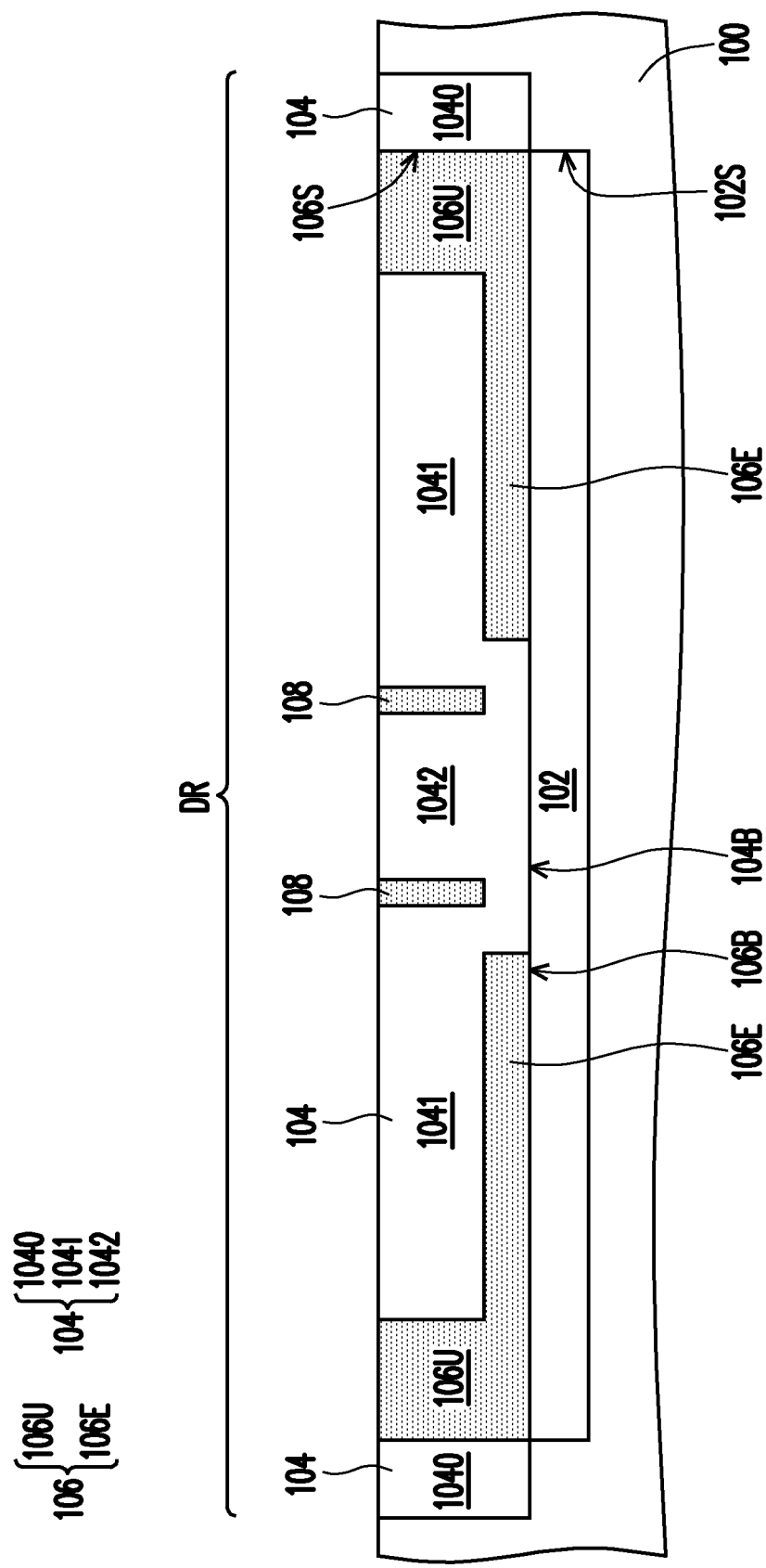
FIG. 1 to FIG. 8 are schematic cross-sectional views of various stages in a manufacturing method of a semiconductor device in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

It should be appreciated that the following embodiment(s) of the present disclosure provides applicable concepts that can be embodied in a wide variety of specific contexts. The specific embodiment(s) discussed herein is merely illustrative and is related to an integration structure containing more than one type of semiconductor devices, and is not intended to limit the scope of the present disclosure. Embodiments of the present disclosure describe the exemplary manufacturing process of integration structures formed with one or more MOS devices and the integration structures fabricated therefrom. Certain embodiments of the present disclosure are related to the structures including semiconductor MOS devices such as laterally diffused MOS (LDMOS) and other semiconductor devices. The substrates and/or wafers may include one or more types of integrated circuits or electronic components therein. The semiconductor device(s) may be formed on a bulk semiconductor substrate or a silicon/germanium-on-insulator substrate. The embodiments are intended to provide further explanations but are not used to limit the scope of the present disclosure.

FIG. 1 to FIG. 8 are schematic cross-sectional views of various stages in a manufacturing method of a semiconductor device in accordance with some embodiments of the disclosure.

Referring to FIG. 1, in some embodiments, a substrate 100 is provided. As shown in FIG. 1, in some embodiments, the substrate 100 includes a device region DR, and the device region DR may be defined by isolation structures or isolating regions separating and isolating the active region DR. In some embodiments, the substrate 100 may further includes other active components such as transistors, diodes, optoelectronic devices or the like, and/or passive components such as capacitors.

In some embodiments, the substrate 100 is a semiconductor substrate. In one embodiment, the substrate 100 comprises a crystalline silicon substrate (e.g., wafer). In certain embodiments, the substrate 100 may include a doped semiconductor substrate. In one embodiment, the substrate 100 includes a P-type semiconductor substrate. In one embodiment, the substrate 100 includes an N-type semiconductor substrate. For N-type doping, arsenic or phosphorus is added to the semiconductor material such as silicon. For P-type doping, boron or gallium is used as the dopant added to the semiconductor material such as silicon.

In some alternative embodiments, the substrate 100 is made of other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

In FIG. 1, in some embodiments, the substrate 100 includes a first conductive type semiconductor substrate, and the substrate 100 comprises a deep second conductive type doped well 102 and a second conductive type doped well 104 formed therein. In one embodiment, the first conductive type is P-type, and the second conductive type is N-type. In another embodiment, the first conductive type is N-type, and the second conductive type is P-type.

In some embodiments, the substrate 100 is a P-type silicon substrate, and the deep second conductive type doped well 102 is a deep N-type well and the second conductive type doped well 104 is an N-type well.

In some embodiments, ion implantation processes are performed through mask patterns (not shown) covering the substrate 100 to dope second conductive type dopants into the substrate 100 to form the deep second conductive type doped well 102 and the second conductive type doped well 104. In one embodiment, the ion implantation processes are performed to dope N-type dopants in to the substrate 100 to form the N-type well 104 and the deep N-type well 102 in sequence. In some embodiments, the deep second conductive type doped well 102 (e.g. deep N-type well) is formed with a depth deeper than a depth of the second conductive type doped well 104 (e.g. N-type well), but the second conductive type doped well 104 (e.g. N-type well) is formed with a span larger than that of the deep second conductive type doped well 102 (e.g. deep N-type well). For example, N-type dopants are phosphorus or arsenic.

Referring to FIG. 1, after the formation of the deep second conductive type doped well 102 and the second conductive type doped well 104, a first conductive type body well 106 is formed and a first conductive type doped well 108 is formed. In some embodiments, the first conductive type body well 106 is a P-type body well and the first conductive type doped well 108 is a P-type doped region. In one embodiment, the ion implantation processes are performed to dope P-type dopants in to the substrate 100 to form the P-type body well 106 and the P-type well 108. For example, P-type dopants are boron or gallium.

Figure 1A:
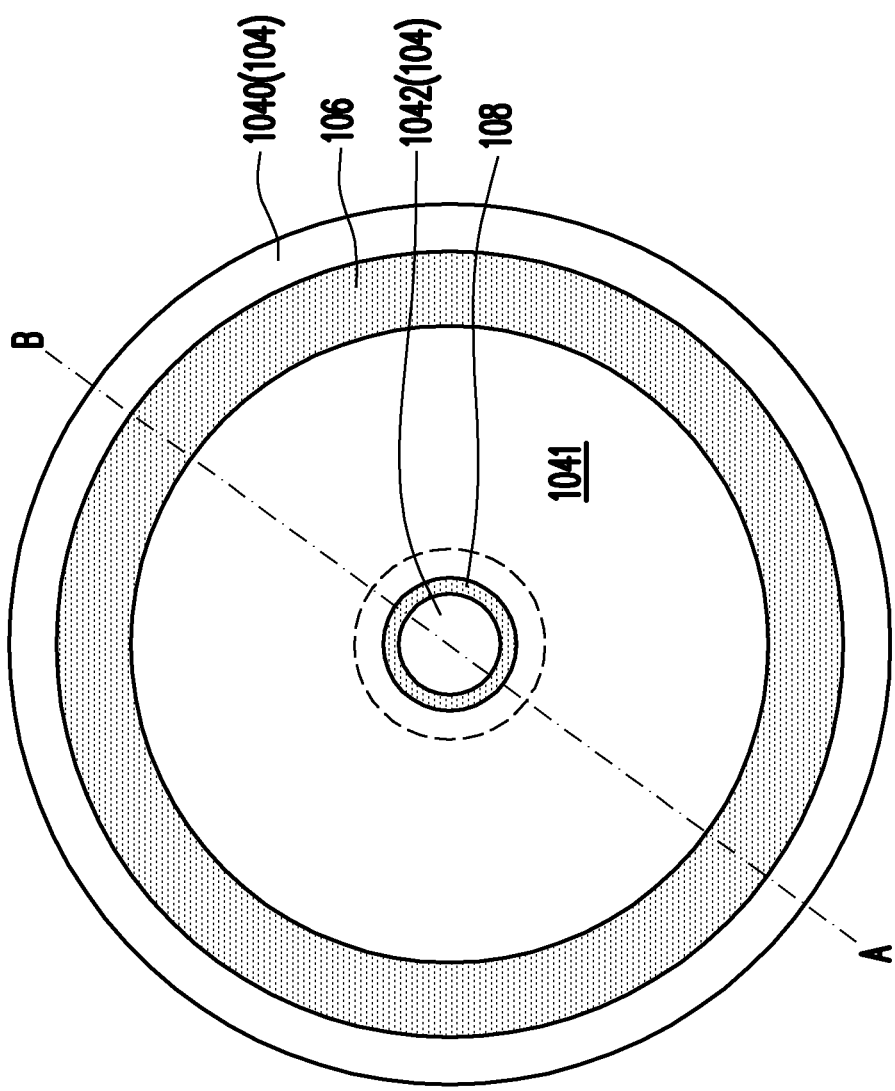
FIG. 1A, FIG. 2A, FIG. 4A, FIG. 5A, FIG. 6A, FIG. 7A and FIG. 8A are schematic exemplary top views of portions of the structure of the semiconductor device.

FIG. 1A is a schematic top view of an exemplary embodiment of the structure of FIG. 1. From the schematic top view of FIG. 1A, the deep second conductive type doped well 102 is formed as a round shaped doped region with a deeper depth but a smaller span, and the second conductive type doped well 104 is formed as a round shaped doped region having a shallower depth and a larger span at a location overlapping with the deep second conductive type doped well 102. From the schematic top view, the deep second conductive type doped well 102 and the second conductive type doped well 104 may be shaped like concentric circles.

In some embodiments, referring to FIG. 1A, the first conductive type body well 106 is formed as a ring shape with a hoop body portion 106U and an inner extended brim portion 106E extending toward the center of the ring. In some embodiments, the first conductive type body well 106 is located within the deep second conductive type doped well 102 and the second conductive type doped well 104. In some embodiments, the first conductive type body well 106 is located at the bottom of the second conductive type doped well 104, and the hoop body portion 106U that extends from the bottom of the second conductive type doped well 104 to the substrate surface 100T has an extension depth larger than that of the brim portion 106E. In one embodiment, referring to FIG. 1, the outer side surfaces 106S of the first conductive type body well 106 are substantially aligned with the side surfaces 102S of the deep second conductive type body well 102. In one embodiment, the bottom surface 106B of the first conductive type body well 106 is levelled with the bottom surface 104B of the second conductive type doped well 104. In some embodiments, the depth of the hoop body portion 106U of the first conductive type body well 106 is about the same as that of the second conductive type doped well 104.

In some embodiments, referring to FIG. 1 and FIG. 1A, the first conductive type doped well 108 is formed as a ring shape located within the second conductive type doped well 104 and is located within the span of the first conductive type body well 106 but separate from the first conductive type body well 106. In some embodiments, the first conductive type doped well 108 is located in a central location of the first conductive type body well 106 and between the extended ring portion 106E. In one embodiment, the depth of the first conductive type doped well 108 is shallower than those of the first conductive type body well 106 and the second conductive type doped well 104. After the formation of the first conductive type body well 106 and the first conductive type doped well 108, the second conductive type doped well 104 is defined as an outer portion 1040 outside the first conductive type body well 106, an inner portion 1041 inside the first conductive type body well 106 and a central portion 1042 inside the first conductive type doped well 108.

Figure 2:
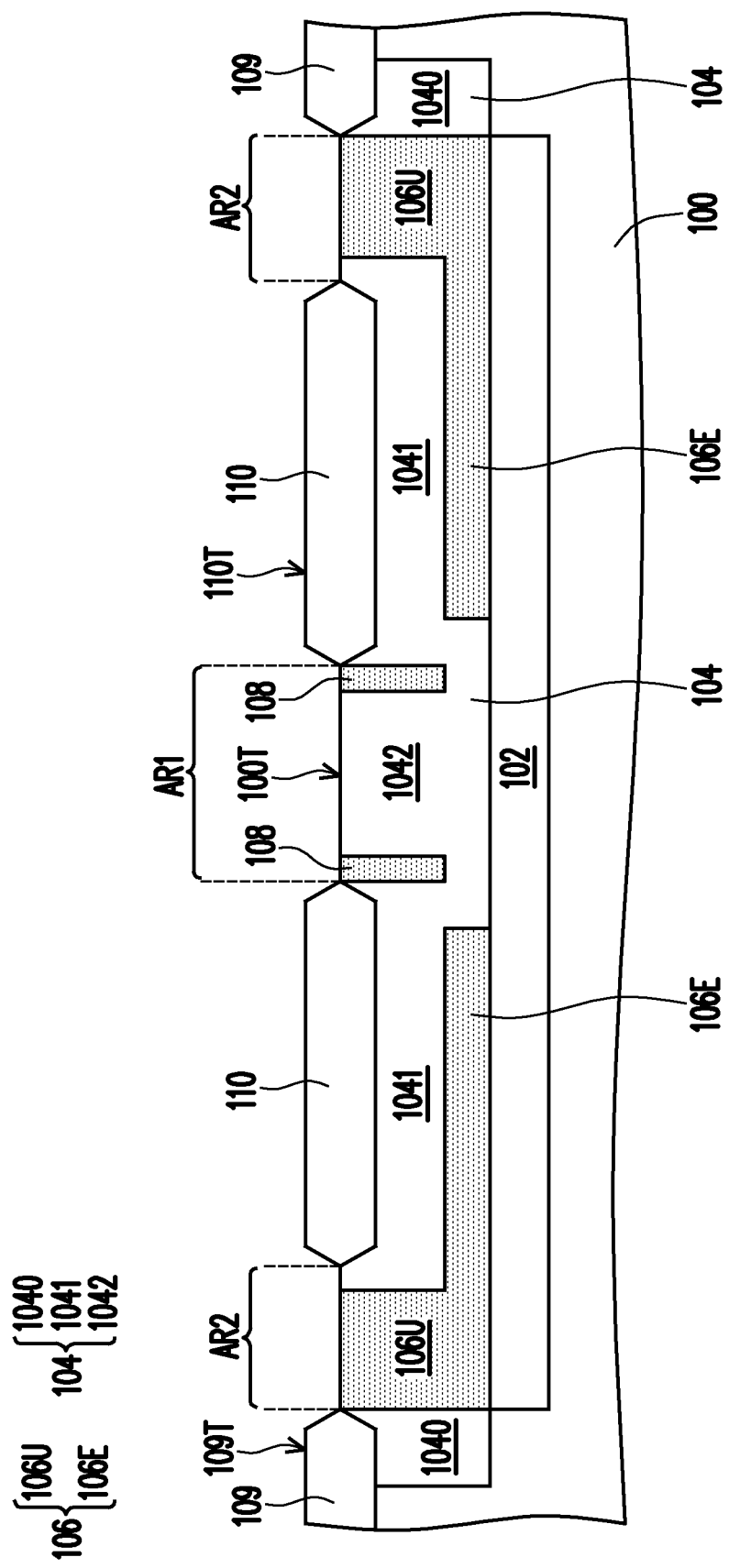

As shown in FIG. 2, in some embodiments, more than one isolation structures 109, 110 are formed in the substrate 100. In certain embodiments, the isolation structures 109, 110 are oxide isolation structures. The formation of the oxide isolation structures includes, for example, performing a thermal oxidation process to oxidize the uncovered surface of the substrate 100. In one embodiment, the thermal oxidation process is, for example, a local oxidation of silicon (LOCOS) process or shallow trench isolation (STI) process. In some embodiments, the formation of the isolation structures 109, 110 includes using a mask pattern (not shown) formed over the substrate 100 to exposes a part of the substrate surface to define an area where the isolation structures to be formed subsequently and then the thermal oxidation process is performed. In one embodiment, the mask pattern may include a pad oxide layer (not shown) and a silicon nitride layer (not shown), and after the thermal oxidation process, both layers are sequentially removed.

In FIG. 2, at least one isolation structure 110 is formed within the enclosed region (i.e. the inner portion 1041) surrounded by the first conductive type body well 106 and located between the first conductive type body well 106 and the first conductive type doped well 108. In one embodiment, one end of the isolation structure 110 physically contacts the outer edge of the first conductive type doped well 108, while the other end of the isolation structure 110 is located at a position close to but spaced apart from the first conductive type body well 106. In addition, another isolation structure 109 is located above the second conductive type doped well 104, or right above the outer portion 1040 outside the first conductive type body well 106.

The number of the isolation structures 109, 110 shown in FIG. 2 is merely for illustration, in some alternative embodiments, more or less isolation structures may be formed in accordance with actual design requirements. In some embodiments, the isolation structures 109, 110 are shaped as rings, strips or blocks and arranged aside the active region(s) or in parallel, and it is understood that the shape(s) and size(s) of the isolation structures are not limited by the embodiments herein. In some embodiments, as shown in FIG. 2, top surfaces 109T, 110T of the isolation structures 109, 110 are higher than the top surface 100T of the substrate 100.

Figure 2A:
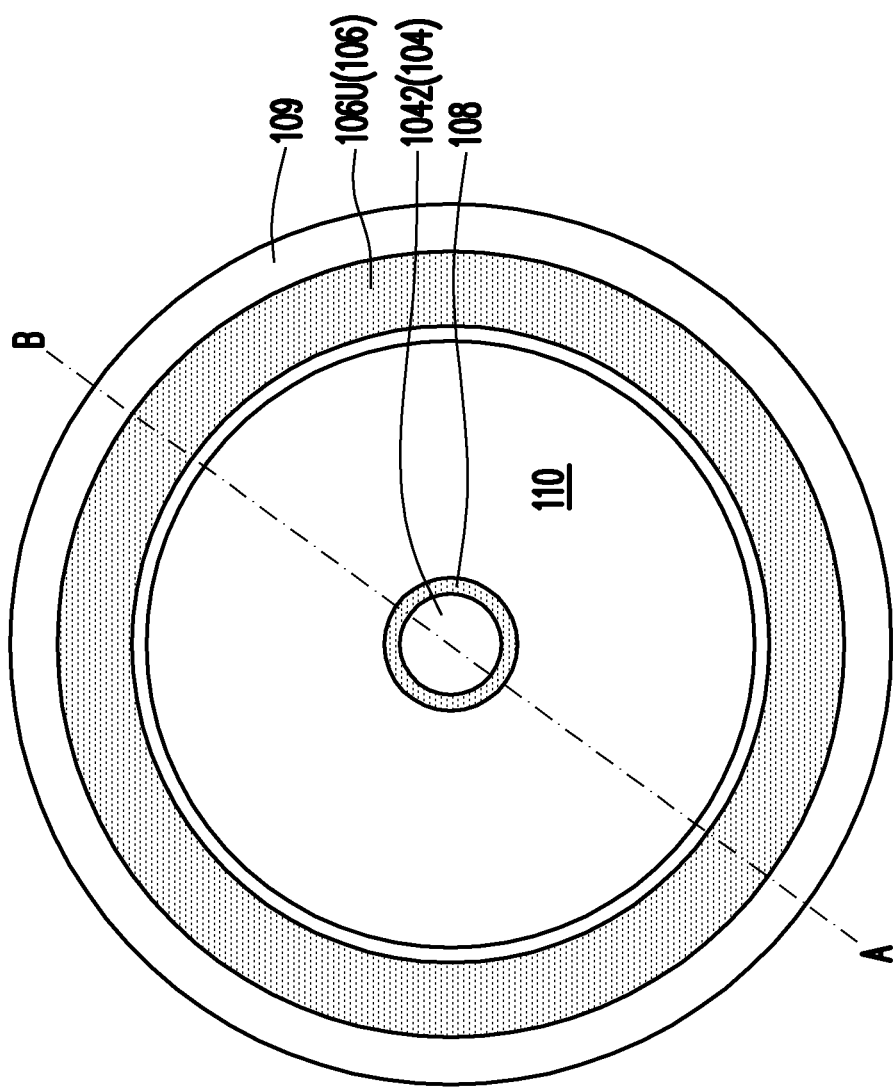

FIG. 2A is a schematic top view of an exemplary embodiment of the structure of FIG. 2. Referring to the schematic top view of FIG. 2A and to FIG. 2, the active regions AR1 and AR2 are defined by the isolation structures 109, 110, and the uncovered portions (uncovered by the isolation structures 109, 110) or the exposed portions of the substrate surface are defined as the active region AR1 (defined by the isolation structure 110) and the active region AR2 (sandwiched between and defined by the isolation structures 109, 110). In some embodiments, the active region AR1 defined by the isolation structure 110 is round shaped, while the active region AR2 sandwiched between and defined by the isolation structures 109, 110 is ring-shaped.

Figure 3:
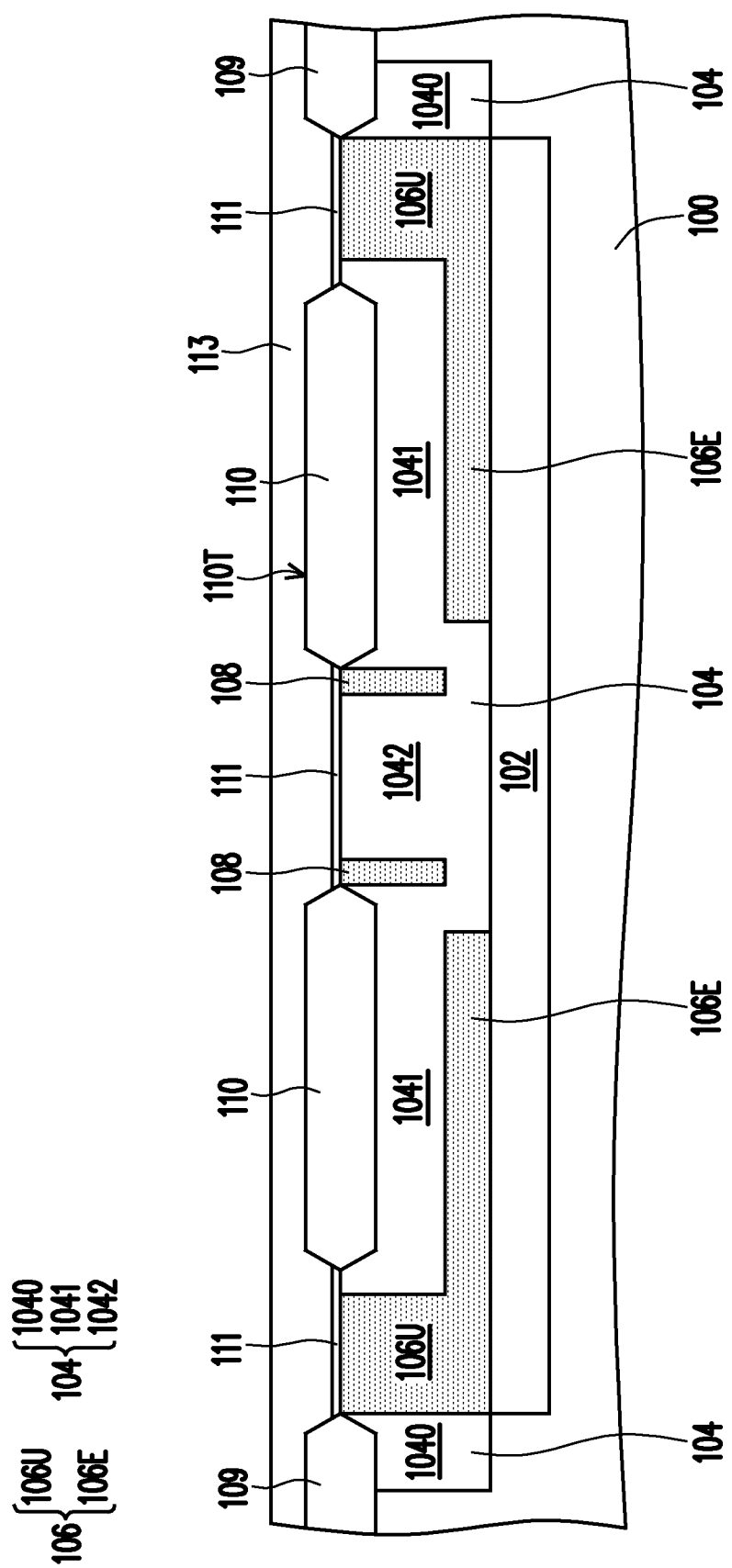

Referring to FIG. 3, in some embodiments, an oxide layer 111 is formed on the exposed substrate surface 100T. The formation of the oxide layer 111 may include performing a thermal oxidation process to the substrate 100. It is understood that the thickness of the oxide layer may be tuned by the temperature, the duration and other conditions of the thermal oxidation process, and the thermal process used for forming the oxide layer 111 may utilize conditions different from those used in the thermal oxidation process for forming the isolation structures 110. In some embodiments, the oxide layer 111 is formed not only on the active regions AR1, AR2 (i.e. the exposed substrate surface 100T) but also is formed with a less thickness on the isolation structures 110 or the non-active region. Later, a conductive semiconductor material layer 113 is formed over the substrate 100 covering the isolation structures 110 and the oxide layer 111. In some embodiments, the conductive semiconductor material layer 113 includes a polysilicon layer. In some embodiments, the polysilicon layer is an undoped polysilicon layer is formed by, for example, chemical vapor deposition (CVD). In some embodiments, the polysilicon layer is a doped polysilicon layer is formed by, for example, CVD along with in-situ doping.

Figure 4:
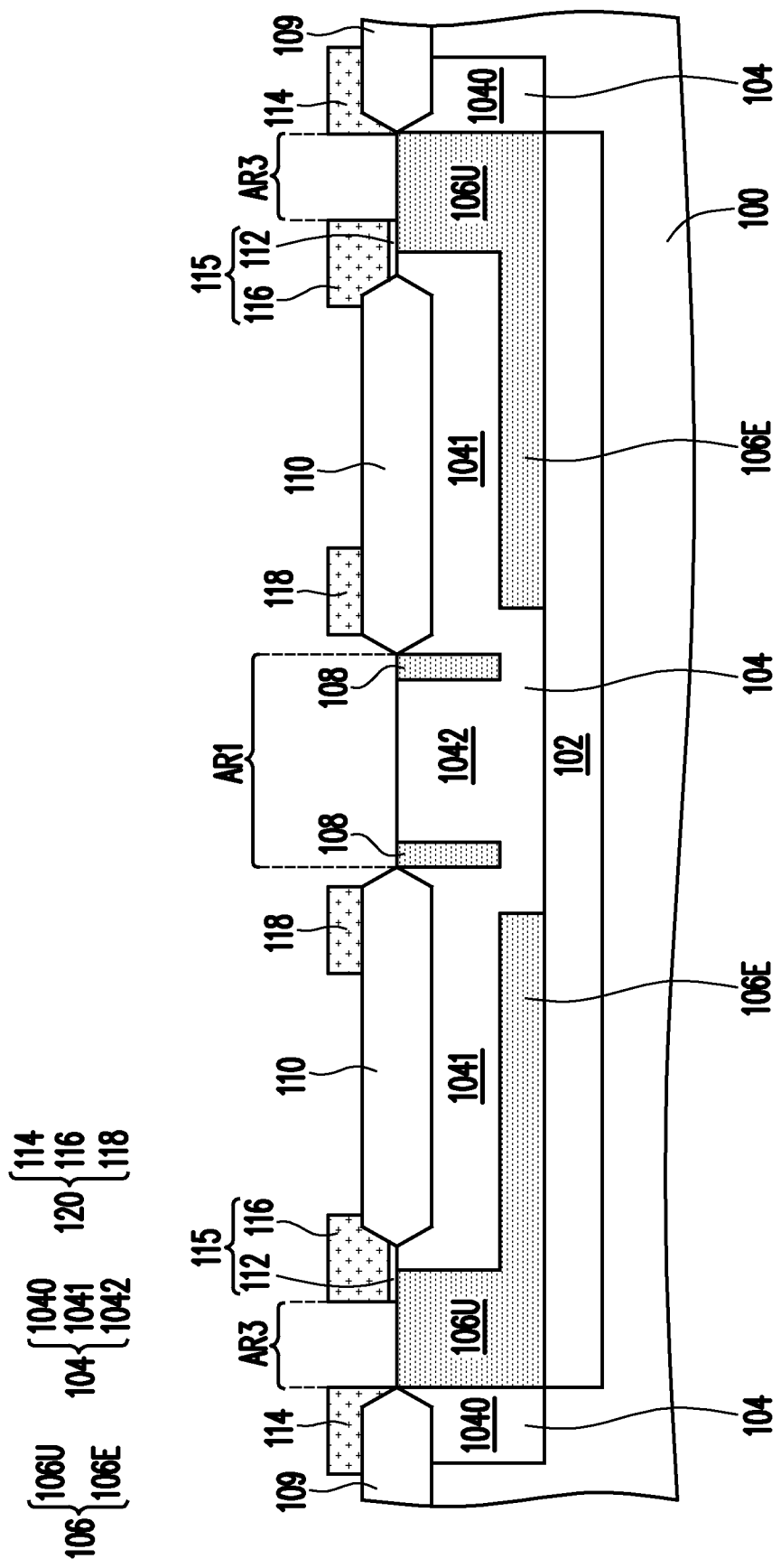

Referring to FIG. 4, a patterning process is performed to pattern the conductive semiconductor material layer 113 into conductive blocks 114, 116 and 118 and to pattern the oxide layer 111 into a gate oxide layer 112. In some embodiments, the conductive block 114 is located on the isolation structure 109 above the outer portion 1040 of the second conductive type doped well 104.

Figure 4A:
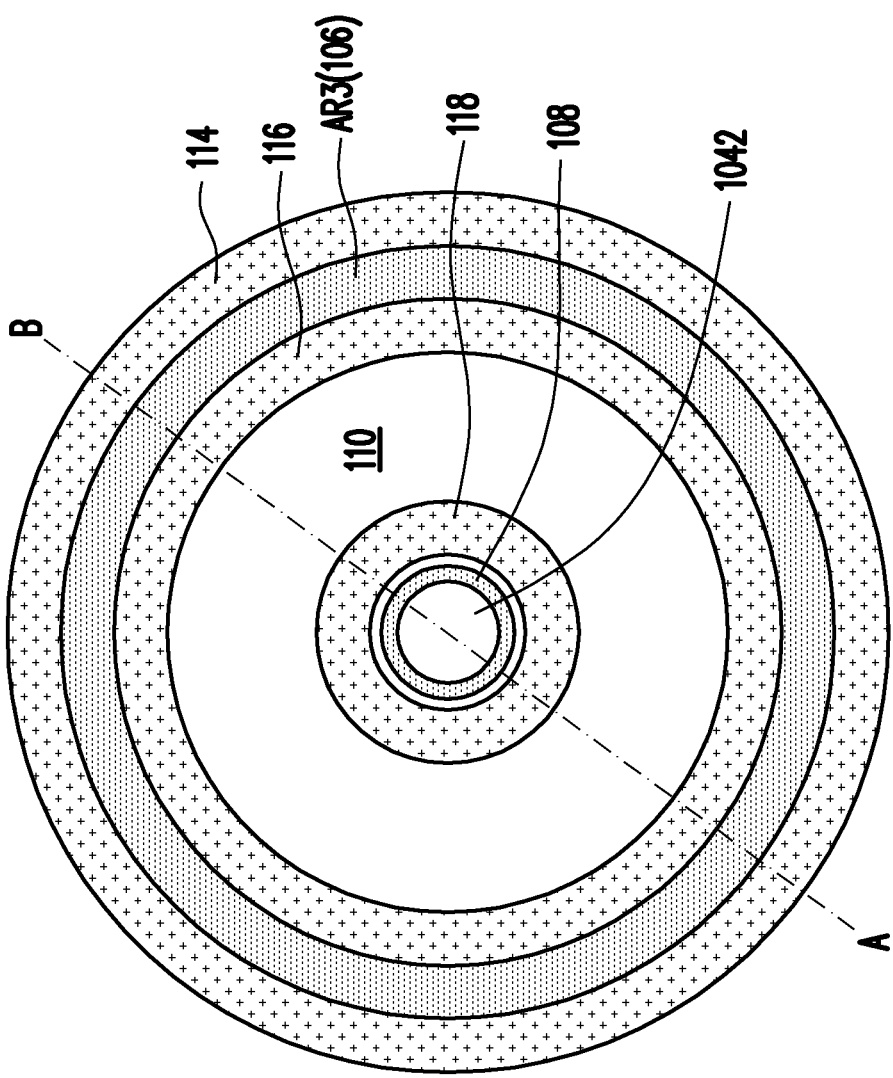

FIG. 4A is a schematic top view of an exemplary embodiment of the structure of FIG. 4. Referring to the schematic top view of FIG. 4A and to FIG. 4, in one embodiment, the conductive block 114 is formed in a ring shape and may function as a grounding line. In some embodiments, the conductive block 118 is located on the isolation structure 110 above the inner portion 1041 of the second conductive type doped well 104. In one embodiment, the conductive block 118 is formed in a ring shape as shown in FIG. 4A and may function as a field plate. During the patterning process, most of the oxide layer 111 on the active regions AR1, AR2 is removed, except that a portion of the oxide layer 111 on the active region AR2 is remained and become the gate oxide layer 112. In some embodiments, the conductive blocks 114 and 118 are in direct contact with the underlying isolation structures 109, 110. In some embodiments, the conductive blocks 114 and 118 are located on the underlying isolation structures 109, 110 with the oxide layer therebetween. In some embodiments, after patterning, a stack 115 of the gate oxide layer 112 and the conductive block 116 located on the patterned gate oxide layer 112 is formed, and such stack 115 is located on the isolation structure 110, extends over the inner portion 1041 of the second conductive type doped well 104 and reaches the first conductive type body well 106. In one embodiment, the stack 115 of the gate oxide layer 112 and the conductive block 116 is formed in a ring shape as shown in FIG. 4A and may function as a gate structure. That is, the conductive block 116 and the gate oxide layer 112 function as the gate electrode and gate dielectric layer of the gate stack. As the conductive blocks 114, 116 and 118 are formed from the same layer 113 and may be considered as a first set of conductive blocks 120. After the formation of the stack 115 covering a portion of the active region AR2 (see FIG. 2), as shown in FIG. 4 and FIG. 4A, a portion of the first conductive type body well 106 is exposed as a ring-shaped and defined as the active region AR3.

Figure 5:
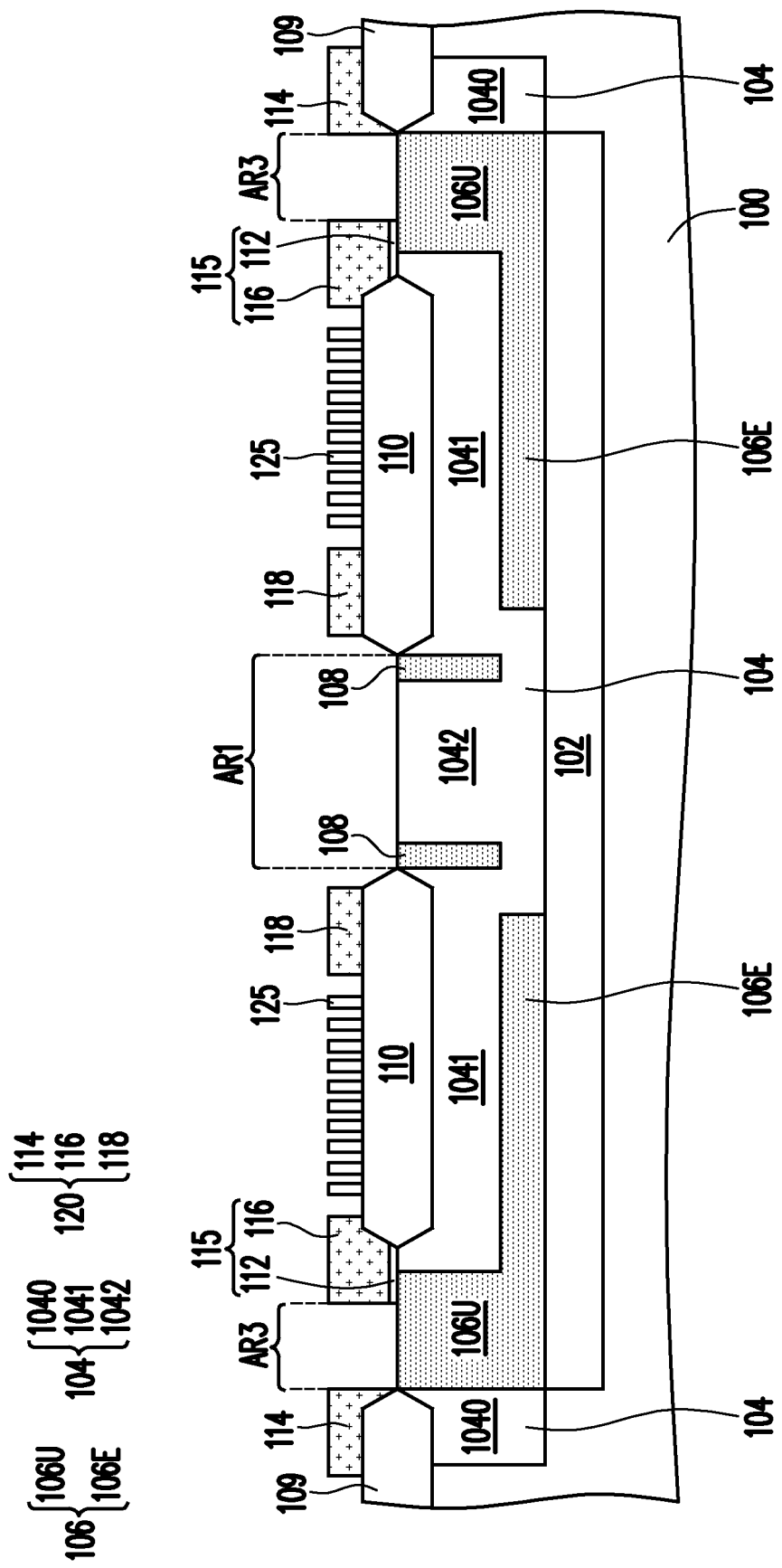
Figure 5A:
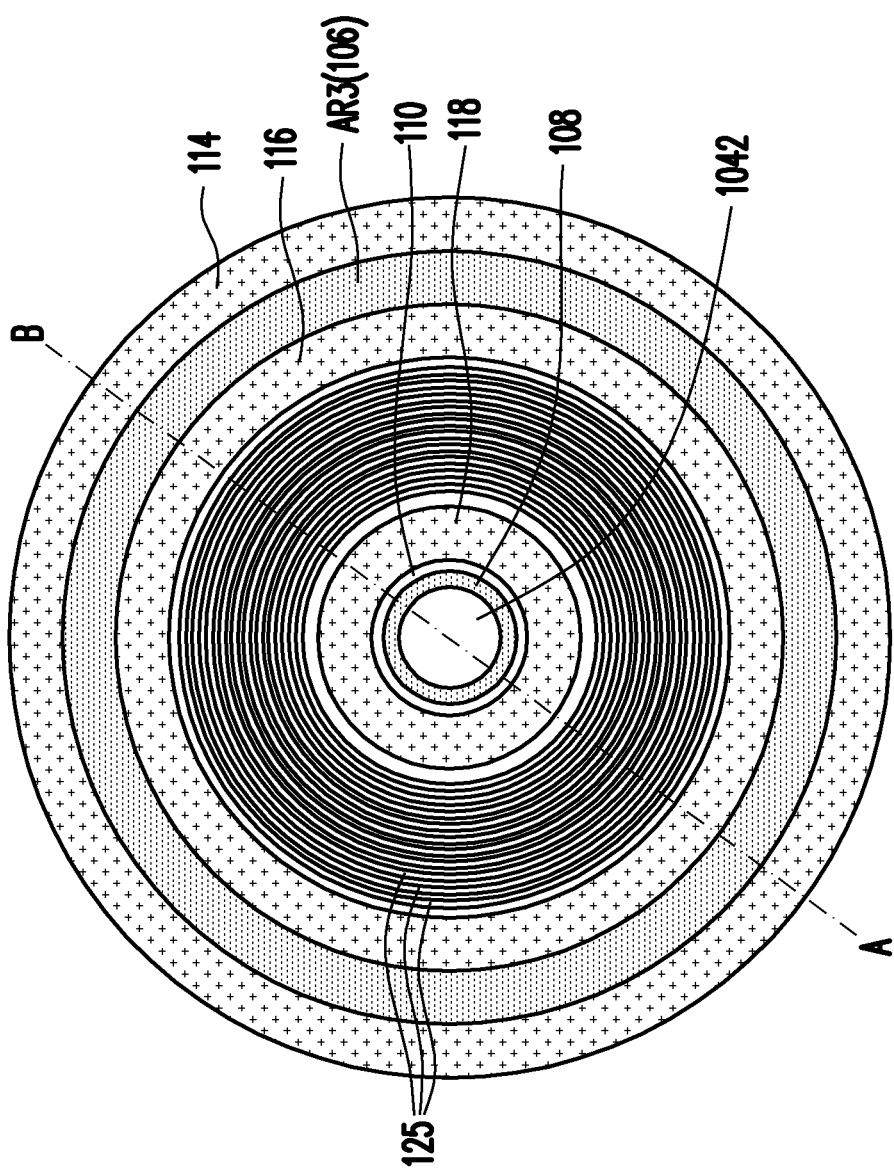

FIG. 5A is a schematic top view of an exemplary embodiment of the structure of FIG. 5. In some embodiments, referring to FIG. 5 and FIG. 5A, semiconductor patterns 125 are formed on the isolation structure 110 and located between the conductive block 118 and the conductive block 116 of the stack 115. In some embodiments, referring to FIG. 5A, the semiconductor patterns 125 may be formed in a spiral shape or coil shape and function as passive elements such as resistors or inductors. In some embodiments, the formation of the semiconductor patterns 125 includes forming a conductive semiconductor material (not shown) over the substrate 100 covering the conductive blocks 120 and the isolation structures 110, and then patterning the conductive semiconductor material into the semiconductor patterns 125. In some embodiments, the formation of the semiconductor patterns 125 further includes performing an implantation process to dope the conductive semiconductor material. In some embodiments, the conductive semiconductor material includes polysilicon formed by CVD. In some embodiments, the conductive semiconductor material includes amorphous silicon formed by furnace. In some embodiments, the conductive semiconductor material includes doped polysilicon formed by, for example, CVD along with in-situ doping. In some embodiments, the patterning of the conductive semiconductor material may include performing one or more etching processes to etch the conductive semiconductor material using the same mask pattern, at the same time or in sequence.

Figure 6:
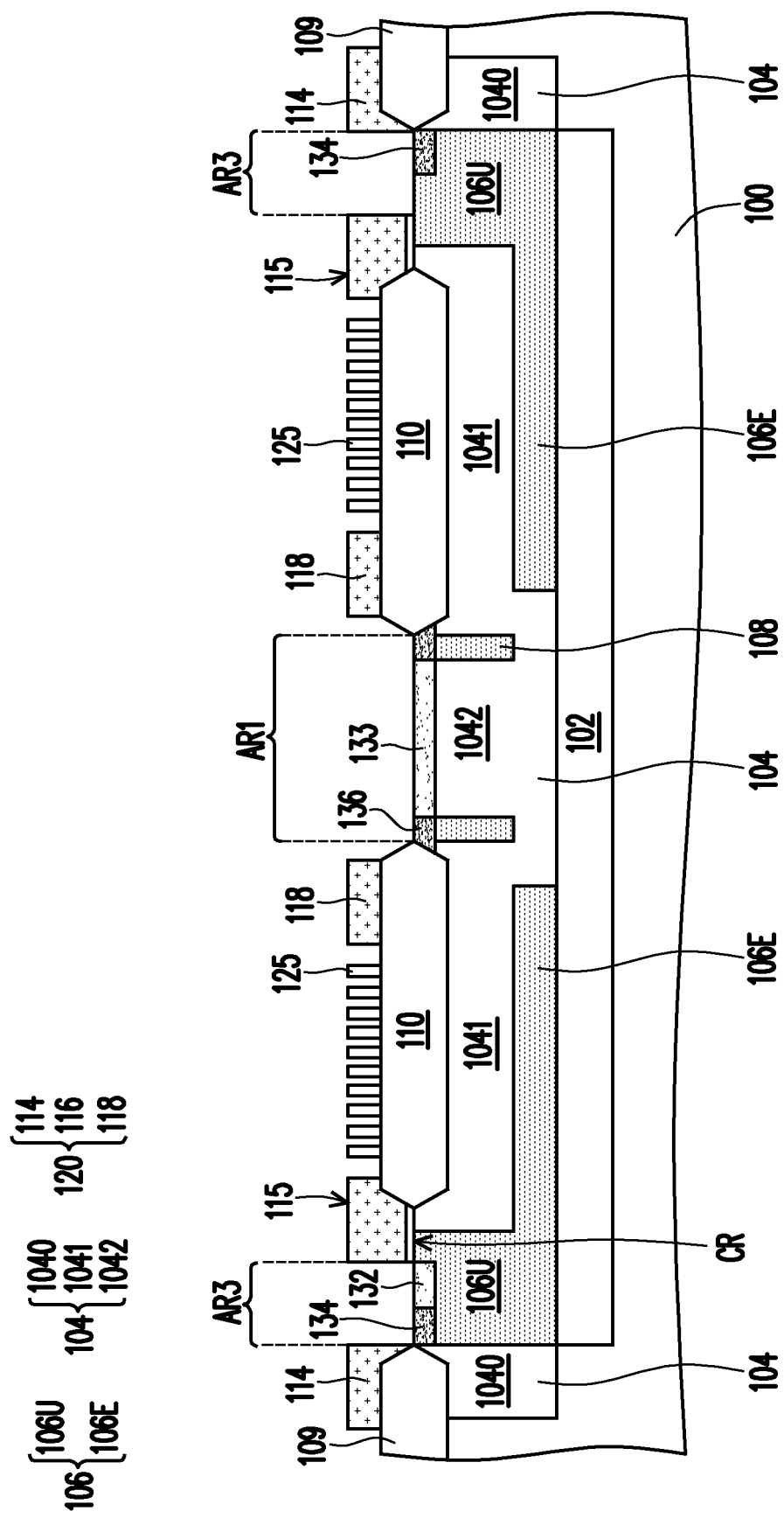
Figure 6A:
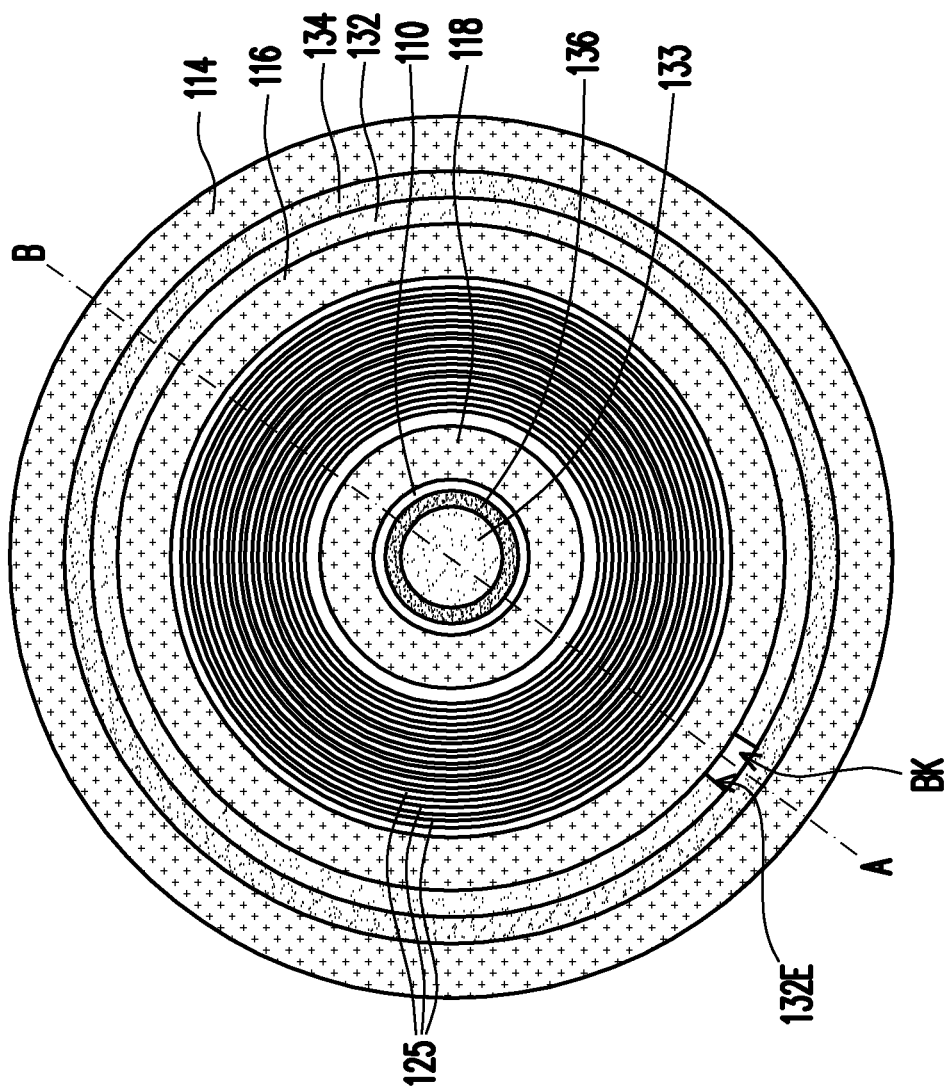

FIG. 6A is a schematic top view of an exemplary embodiment of the structure of FIG. 6. Referring to FIG. 6, within the active region AR3, a second conductive type doped region 132 is formed in the substrate 100 beside the stack 115, and a second conductive type doped region 133 is formed in the substrate 100 within the active region AR1 encircled by the isolation structure 110 and the conductive block 118. Referring to FIG. 6 and FIG. 6A, the second conductive type doped regions 133 may be a round doped region located within and encircled by the ring-shaped first conductive type doped well 108 and located within the ring-shaped conductive block 118. In some embodiments, the doped region 133 functions as a drain region. From the schematic top views of FIG. 6A, it is seen that the second conductive type doped region 132 is formed as a C-shaped ring or in an open ring shape. In some embodiments, from the schematic top views of FIG. 6A and FIG. 10, the second conductive type doped region 132 may be shaped as a round ring with a break BK (the untreated region of the first conductive type body well 106) located between both ends 132E of the second conductive type doped region 132. That is, during the formation of the second conductive type doped region 132, none or very little of the second conductive type of dopants are implanted into the break region. In some embodiments, the location of the break BK corresponds to a crossing location of a subsequently formed high voltage interconnection (HVI) metal line. In some embodiments, the doped region 132 functions as a source region.

Figure 9:
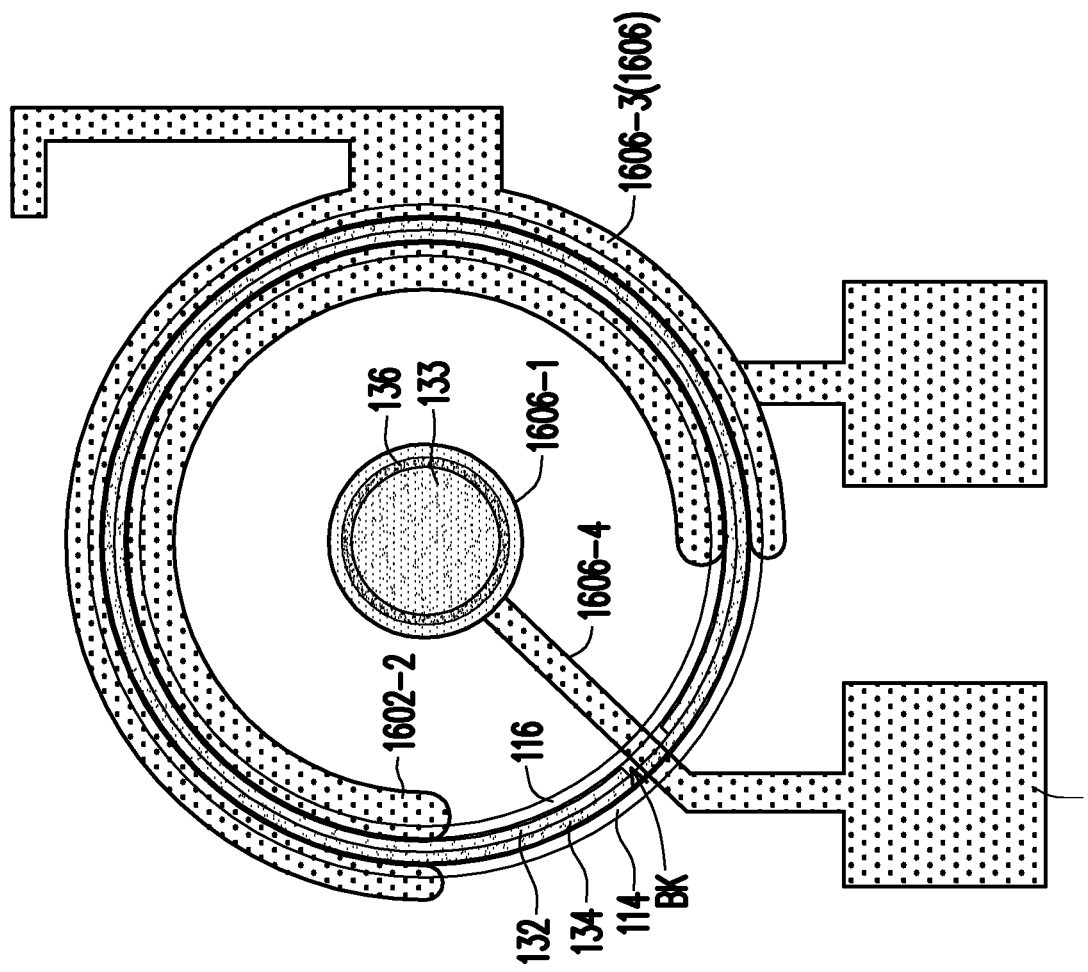
FIG. 9 is a schematic top view showing a portion of the structure including a high voltage semiconductor device in accordance with some embodiments of the disclosure.

In FIG. 6, in some embodiments, first conductive type doped regions 134 and 136 are formed in the substrate 100 respectively within the active regions AR1 and AR3. Referring to FIG. 6 and FIG. 6A, the first conductive type doped region 134 is formed as a ring-shaped located next to the second conductive type doped regions 132 and located between the conductive block 114 and the second conductive type doped regions 132. In some embodiments, the first conductive type doped regions 136 is formed right beside the second conductive type doped regions 133 and located between the conductive block 118 and the second conductive type doped regions 133. As seen in FIG. 9, in some embodiments, the first conductive type doped regions 134 is formed in a ring-shape enclosing the C-shaped ring region of the second conductive type doped region 132. Also seen in FIG. 9, the first conductive type doped regions 136 is formed in a ring-shape enclosing the round doped region of the second conductive type doped region 133.

Referring to FIG. 6, the doped regions 132, 133, 134 and 136 are formed in the substrate 100 within the active regions AR1 & AR3. The doped regions may be doped with dopants of different conductive types. In some embodiments, the second conductive type doped regions 132, 133 are N-type doped regions, while the first conductive type doped regions 134 and 136 are P-type doped regions. In one embodiment, the N-type doped regions are doped with phosphorus, and the P-type doped regions are doped with boron, following the CMOS processes, for example. In some embodiments, the second conductive type doped region 132 is a N-type doped region and functions as the source for NMOS structure. In some embodiments, the second conductive type doped region 132 is a P-type doped region and functions as the source for PMOS structure.

In certain embodiments, the second conductive type doped regions 132, 133 are formed before the first conductive type doped regions 134, 136 are formed. For example, the doped regions of the same conductive type are formed by performing ion implantation to the exposed substrate 100 using a photoresist pattern (not shown) partially covering the substrate 100 as the mask, and a thermal process may be performed to further drive the dopants into the substrate with desirable profiles, and doped regions of different conductive types are formed in sequence or individually. In some embodiments, the doped regions 132, 133, 134 and 136 are formed in the substrate 100 with substantially the same depths. In one embodiment, doped regions 132, 133, 134 and 136 are formed in the regions exposed by the photoresist pattern and the doped regions 132, 133, 134 and 136 are formed only in the active regions AR1 and AR3. In some embodiments, the doped regions 132, 133, 134 and 136 are shallower than the first conductive type doped well 108 and the isolation structure(s) 110. That is, the depth of the doped regions 132, 133, 134 and 136 is smaller than a depth of the first conductive type doped well 108 (measuring from the top surface 100T of the substrate 100). In some embodiments, the location of the ring-shaped doped region 136 is substantially overlapped with the location of the first conductive type doped well 108 but the ring-shaped doped region 136 has a shallower depth. In some embodiments, the second conductive type doped regions 132 and 133 are formed with a higher dopant concentration than the deep second conductive type doped well 102 and the second conductive type doped well 104. In some embodiments, the first conductive type doped regions 134 and 136 are formed with a higher dopant concentration than the first conductive type body well 106 and the first conductive type doped well 108.

In some embodiments, a laterally diffused metal oxide semiconductor (LDMOS) transistor structure is formed, including the source region 132, the drain region 133, the gate structure 115 and a channel region CR located right under the gate structure 115 within the first conductive type body well 106. In some embodiments, the transistor structure includes the inner portion 1041 under the isolation structure 110, and the inner portion 1041 functions as a drift region or a lightly doped drain extension. Further, for the transistor structure, the gate oxide layer 112 is thin over the entire channel region CR and over part of the drift region, but the oxide of the isolation structure 110 (e.g. LOCOS) underlying the gate structure 115 has a greater thickness. Such transistor structure may be used for high voltage device electrostatic discharge (ESD) protection. In ESD protection design for high voltage applications, the LDMOS transistor structure may be used as an ESD protection device.

Figure 7:
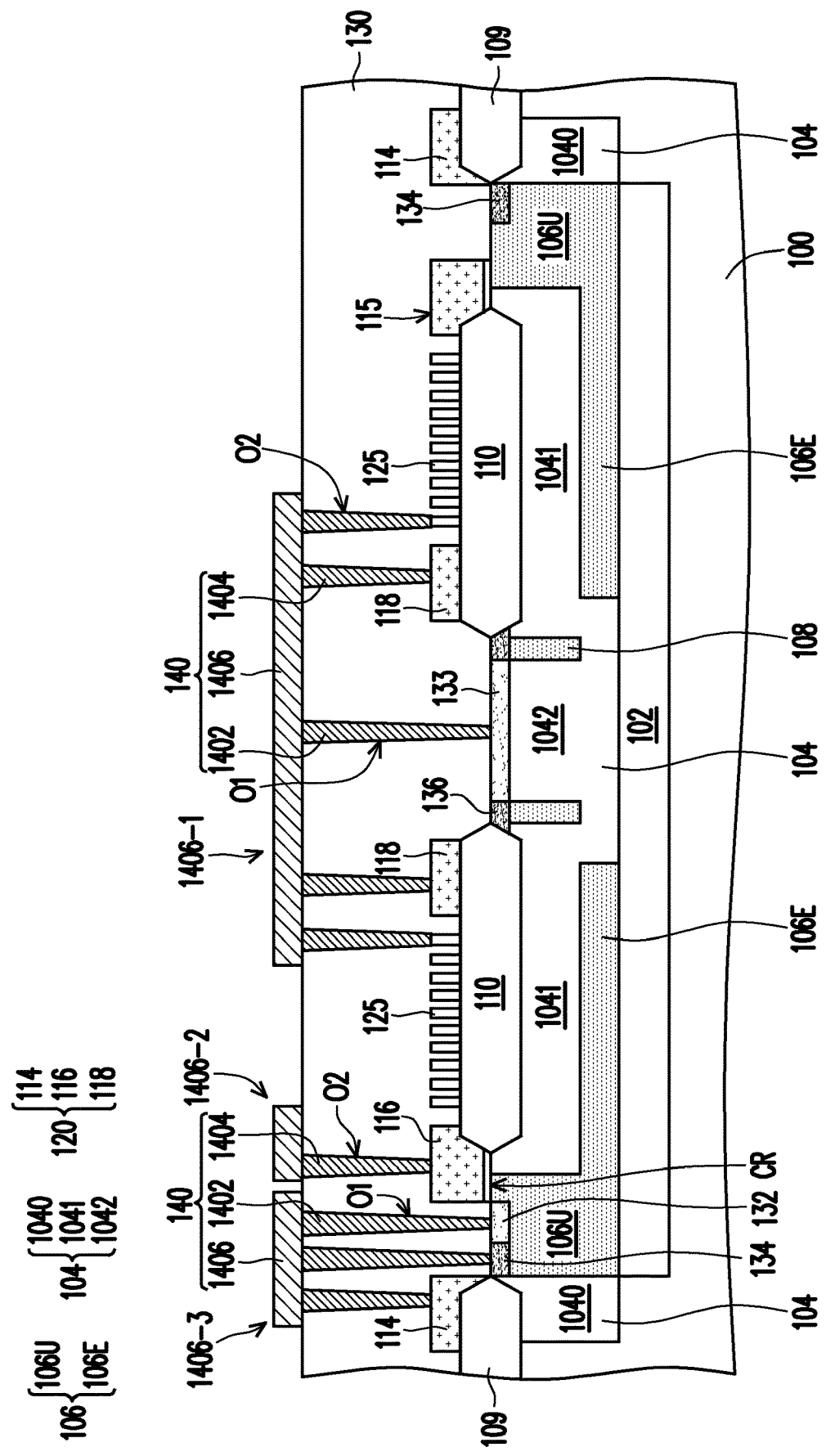

In some embodiments, in FIG. 7, a first inter-dielectric layer 130 is formed over the substrate 100 and the isolation structures 109, 110 covering the conductive blocks 120, the semiconductor patterns 125 and the doped regions 132, 133, 134 and 136. In certain embodiments, the first inter-dielectric layer 130 includes via openings O1 and O2 formed by etching the first inter-dielectric layer 130 using a resist pattern (not shown) as a mask. In some embodiments, the formation of the first inter-dielectric layer 130 includes forming a dielectric material blanketly over the substrate 100 and patterning the dielectric material by performing one or more etching processes, including anisotropic etching, reactive ion etching (RIE), isotropic etching processes or the combination thereof to form the via openings O1, O2 in the first inter-dielectric layer 130. In some embodiments, the via openings O1 expose doped regions 133, 132, 134, and the via openings O2 expose conductive blocks 114, 116, 118 and semiconductor patterns 125. For example, the via openings O1 or O2 may be formed with slant sidewall profiles or substantially vertical sidewall profiles. In some embodiments, the first inter-dielectric layer 130 includes at least one dielectric material selected from silicon oxide, silicon nitride, SiC, silicon carbonitride (SiCN) or a low-k dielectric material. The low-k dielectric material has a k value lower than about 4.0 and includes carbon-containing oxides or silicate glass, for example. In some embodiments, the first inter-dielectric layer 130 is formed by low-pressure chemical vapor deposition (LPCVD), plasma-enhanced chemical vapor deposition (PECVD) and spin-on method(s). In one embodiment, the first inter-dielectric layer 130 may include multiple layers of different dielectric materials or include an etch stop layer, so that the different materials are chosen for suitable etching selectivity.

In some embodiments, referring to FIG. 7, following the formation of the first inter-dielectric layer 130, a first metallization pattern 140 is formed, and the metallization pattern 140 includes via portions 1402, 1404 filled inside the via openings O1, O2 and connecting traces 1406 disposed on the first inter-dielectric layer 130. In some embodiments, the via portions 1402 are electrically connected and in contact with doped regions 132, 133 and 134 respectively, and the via portions 1404 are electrically connected and in contact with conductive blocks 114, 116, 118 and semiconductor patterns 125. In embodiments, the connecting traces 1406 are electrically and physically connect with the via portions 1402, 1404. In some embodiments, the formation of the first metallization pattern 140 includes forming a masking pattern (not shown) on the first inter-dielectric layer 130 and forming a metallic material (not shown) over the first inter-dielectric layer 130 and filling the via openings O1, O2, removing the extra metallic material and then removing the mask pattern. For example, the via portions 1402, 1404 and the connecting traces 1406 may be formed individually or formed in a single process, and the metallic material filling into the via openings O1, O2 may be the same or different from the metallic material used for forming the connecting traces 1406. For example, the metallic material(s) includes copper, tungsten, cobalt, nitrides or alloys thereof. In some embodiments, the metallic material is formed by CVD, PVD or electroplating. It is understood that the formation of the first metallization pattern 140 may include forming a barrier layer and/or an adhesion layer and/or a seed layer as part of the pattern.

Figure 7A:
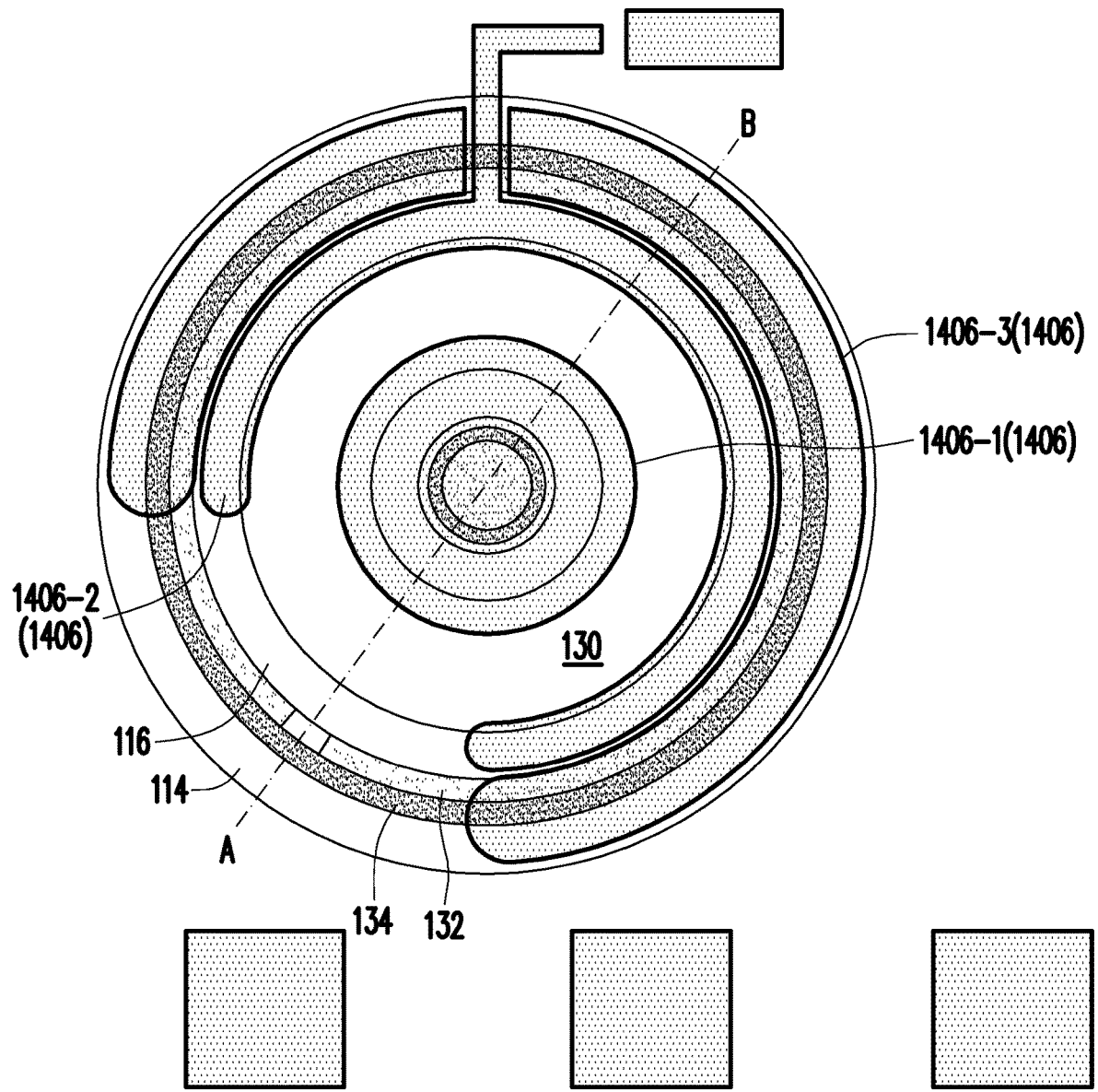

FIG. 7A is a schematic top view of an exemplary embodiment of the structure of FIG. 7. Referring to the schematic top view of FIG. 7A, the connecting traces 1406 of the first metallization pattern 140 includes trace 1406-1 at a location overlapping and covering the active region AR1 and the conductive block 118, trace 1406-2 at a location overlapping and covering the conductive block 116, and trace 1406-3 at a location overlapping and covering the active region AR3 and the conductive block 114. It is understood that more metallic patterns such as extending metallic lines or pads may be formed for further external electrical connection during the formation of the first metallization pattern 140.

Figure 8:
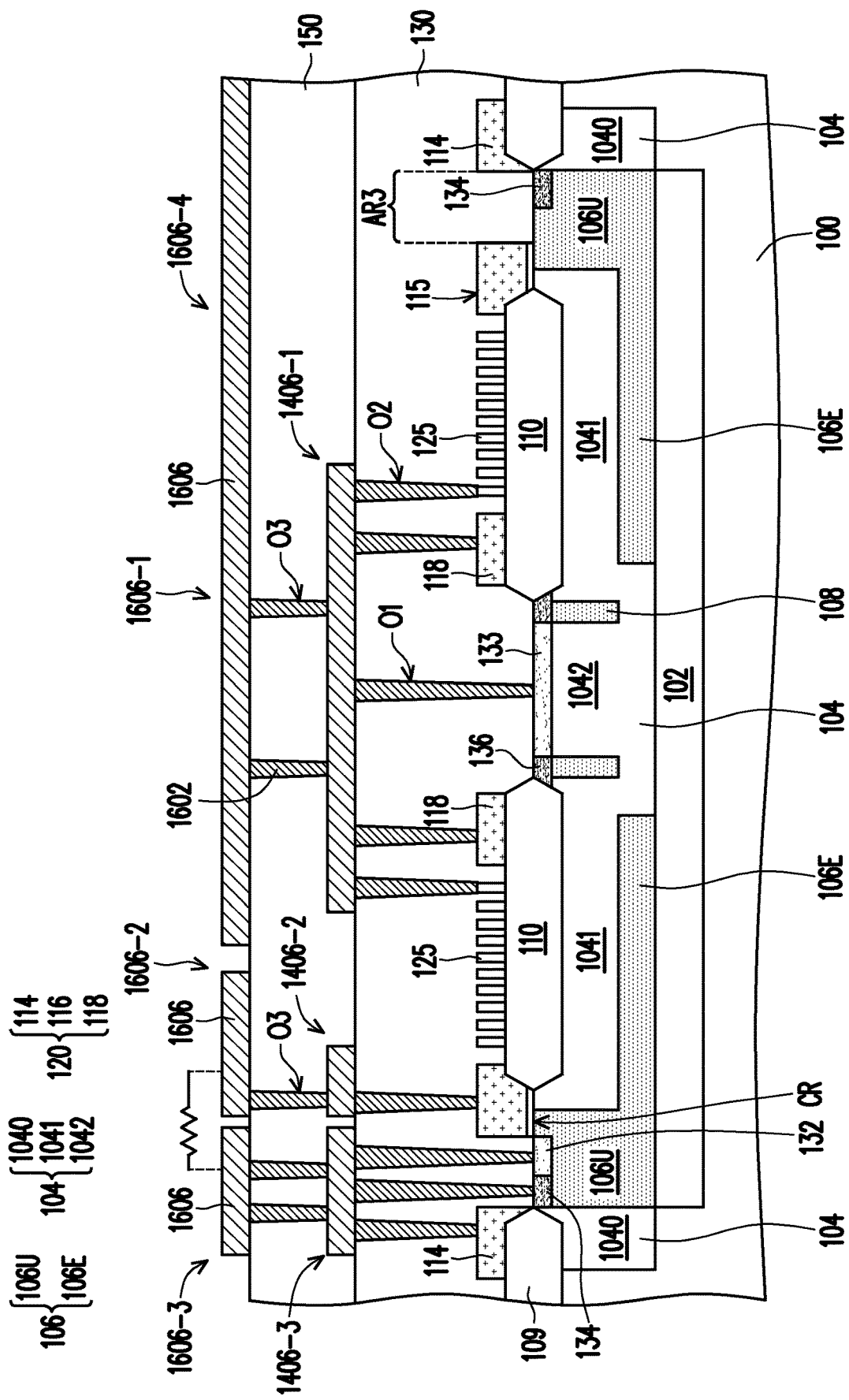

In some embodiments, in FIG. 8, a second inter-dielectric layer 150 is formed over the first inter-dielectric layer 130 and the substrate 100 covering the first metallization patterns 140. In certain embodiments, the second inter-dielectric layer 150 is formed with via openings O3. In some embodiments, the formation of the second inter-dielectric layer 150 includes forming a dielectric material blanketly over the substrate 100, using a resist pattern (not shown) as a mask, and patterning the dielectric material by performing one or more etching processes to form the via openings O3 in the second inter-dielectric layer 150. In some embodiments, the via openings O3 expose the underlying first metallization patterns 140, particularly the connecting traces 1406. For example, the via openings O3 may be formed with slant sidewall profiles or substantially vertical sidewall profiles. In some embodiments, the second inter-dielectric layer 150 includes at least one dielectric material selected from silicon oxide, silicon nitride, SiC, silicon carbonitride (SiCN) or a low-k dielectric material such as carbon-containing oxides or silicate glass. In some embodiments, the second inter0dielectric layer 150 is formed by LPCVD, PECVD and spin-on method(s), for example. In one embodiment, the second inter-dielectric layer 150 may include multiple layers of different dielectric materials or include an etch stop layer, so that the different materials are chosen for suitable etching selectivity. In one embodiment, the material of the second inter-dielectric layer 150 may be different from the material of the first inter-dielectric layer 130. In one embodiment, the material of the second inter-dielectric layer 150 may be the same as the material of the first inter-dielectric layer 130.

In some embodiments, referring to FIG. 8, following the formation of the second inter-dielectric layer 150, a second metallization pattern 160 is formed, and the metallization pattern 160 includes via portions 1602 filled inside the via openings O3 and connecting traces 1606 disposed on and extending on the second inter-dielectric layer 150. In some embodiments, the via portions 1602 are electrically connected and in contact with the connecting traces 1406 respectively, and are further electrically connected with the conductive blocks 114, 116, 118 and the doped regions 132, 133, 134. In embodiments, the connecting traces 1606 are electrically and physically connect with the via portions 1602. In some embodiments, the materials and the formation methods of the second metallization pattern 160 are similar to the materials and methods for forming the first metallization patterns, and details will be omitted herein. It is understood that the formation of the second metallization pattern 160 may include forming a barrier layer and/or an adhesion layer and/or a seed layer as part of the patterns.

Figure 8A:
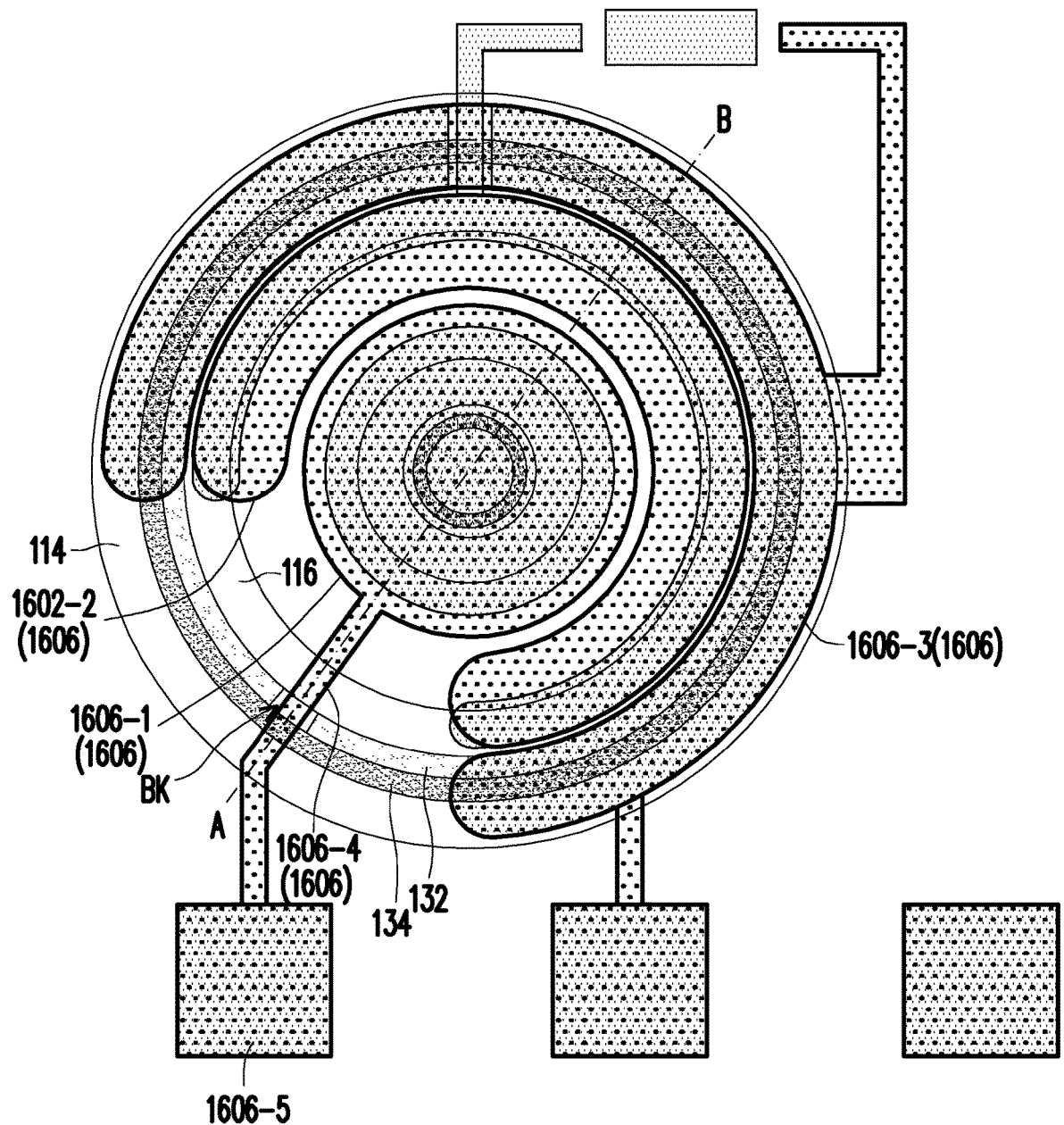

FIG. 8A is a schematic top view of an exemplary embodiment of the structure of FIG. 8. Referring to the schematic top view of FIG. 8A and FIG. 8, the connecting traces 1606 of the second metallization pattern 160 includes trace 1606-1 at a location overlapping and covering the active region AR1, the conductive block 118 and the trace 1406-1, trace 1606-2 at a location overlapping and covering the conductive block 116 and trace 1406-2, and trace 1606-3 at a location overlapping and covering the active region AR3, the conductive block 114 and trace 1406-3. Also, the connecting traces 1606 include trace 1606-4 extending from the trace 1606-1 toward the outer region and connected with an I/O pad 1606-5 located outside of the conductive block 114, and the trace 1606-4 is a high-voltage interconnection (HVI) metal line. Referring to FIGS. 7A & 8A, the round shaped trace 1606-1 is located above and covers the doped regions 133, 136 and adjoins with the trace 1606-4. In FIG. 8 and FIG. 8A, in some embodiments, the doped region 133 functioning as the drain region is electrically connected with the trace 1606-1, 1606-4 and the pad 1606-5 through the via portions 1602, the trace 1406-1 and via portions 1402, 1404. It is understood that more metallic patterns such as extending metallic lines or pads may be formed for further external electrical connection during the formation of the second metallization pattern 160.

Figure 10:
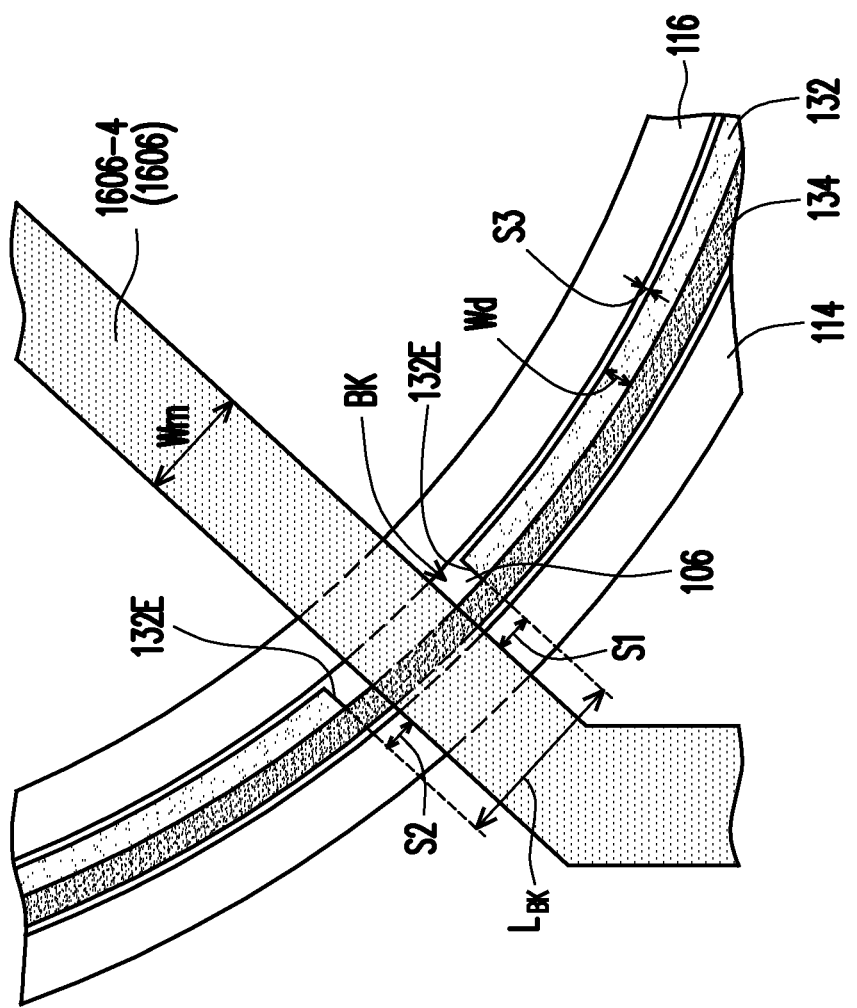
FIG. 10 is a schematic enlarged top view showing the doped ring portion of the structure in accordance with some embodiments of the disclosure.

FIG. 9 is a schematic top view showing a portion of the structure including a high voltage semiconductor device in accordance with some embodiments of the disclosure. FIG. 10 is a schematic enlarged top view showing the doped ring portion of the structure in accordance with some embodiments of the disclosure. Herein, for the illustration purposes, some elements including the semiconductor patterns and first metallization patterns are omitted in FIG. 9 or FIG. 10.

In FIG. 9 and FIG. 10, the first conductive type doped region 134 is formed as a ring-shaped doped region located next to the second conductive type doped regions 132 and located between the conductive block 114 and the second conductive type doped regions 132. As seen in FIG. 9, in some embodiments, the first conductive type doped regions 136 is formed in a ring-shape enclosing the round doped region of the second conductive type doped region 133. In some embodiments, the trace 1606-1 is located above the doped regions 133, 136 and at a location overlapping and covering the doped regions 133, 136. In FIG. 9, the trace 1606-4, a high-voltage interconnection (HVI) metal line, extends from the trace 1606-1 to the pad 1606-5, so as electrically connecting the drain region (doped region 133) to the pad 1606-5. In FIG. 9, the trace 1606-4 extends from the trace 1606-1, across the conductive block 116 of the gate structure and across the break BK and beyond the doped regions 132, 134 and connects to the pad 1606-5. In some embodiments, the trace 1606-4 has a width Wm ranging from about 0.1 microns to about 100 microns. In some embodiments, the trace 1606-4 has a width Wm ranging from about 0.1 microns to about 30 microns.

From the schematic top views of FIG. 9 and FIG. 10, the second conductive type doped region 132 is shaped like a split ring (open ring) or a C-shaped ring with a break BK located between both ends 132E of the second conductive type doped region 132. In some embodiments, as seen in FIG. 10, the vertical projection (along the thickness direction) of the metallic trace 1606-4 falls within the span of the break BK, without touching or overlapping the doped region 132. That is, the overpass location or intersecting location of the trace 1606-4 overlap the location of the break BK. In FIG. 10, both ends 132E are spaced from the trace 1606-4 with a spacing S1 and S2 respectively, and the spacing S1 or S2 ranges from about 0.05 microns to about 20 microns. In some embodiments, the spacing S1 is the same as the spacing S2. In some embodiments, the spacing S1 is different from the spacing S2. In some embodiments, the extending length $L_{BK}$ of the break BK is larger than the width Wm of the trace 1606-4. In some embodiments, the second conductive type doped region 132 is shaped as an open round ring and has a width Wd (in the radial direction) ranging from about 0.05 microns to about 8.0 microns. In some embodiments, a spacing S3 between the second conductive type doped region 132 and the conductive block 116 may be smaller than 5 microns. In one embodiment, a spacing S3 between the second conductive type doped region 132 and the conductive block 116 may be zero. In some embodiments, the extending length $L_{BK}$ of the break BK ranges from about 0.2 microns to about 70 microns. In some embodiments, the ratio of the spacing S1/S2 to the width Wm of the trace 1606-4 ranges from about 5E−4 to about 500. It is understood that the dimensions such as the lengths, widths, spacings are provided as exemplary workable ranges and may be modified along with the pattern and layout designs, and other ranges are well encompassed within the scope of the present disclosure.

As the break region is the untreated region of the first conductive type body well 106 existing between both ends 132E of the second conductive type doped region 132, the second conductive type doped region 132 is not formed as a continuous closed ring-shaped doped region (dope d ring region). In some embodiments, the location of the break BK is located right below the high voltage metal line 1606-4 of the second metallization patterns 160, and the break location corresponds to a crossing location of the high voltage metal line 1606-4 crossing over the doped region 132 (i.e. the intersecting location of the metal line 1606-4 and the extension of the ends 132E of the doped region 132). That is, the C-shaped doped ring region 132 is formed with the break BK at the location directly underlying the traversing high voltage interconnection metal line. Compared with the O-shaped ring doped region forming a continuous path, there is a gap or break in the C-shaped ring doped region 132 and the hot carrier path under the high voltage interconnection metal line is cut-off.

As the hot carrier effect is minimized, the gate oxide layer (or gate dielectric layer) of the gate structure under the high-voltage interaction (HVI) metal line will not be damaged. Through such configuration, the human body mode (HBM) protection level is significantly improved. For example, compared with the configuration with O-shaped ring doped region, the configuration designed with C-shaped ring doped region causes the HBM protection level increased from 500V (with) to 2500V (with) and HBM endurance deviation reduced from 2000V to 500V (~78% decrease).

Figure 11:
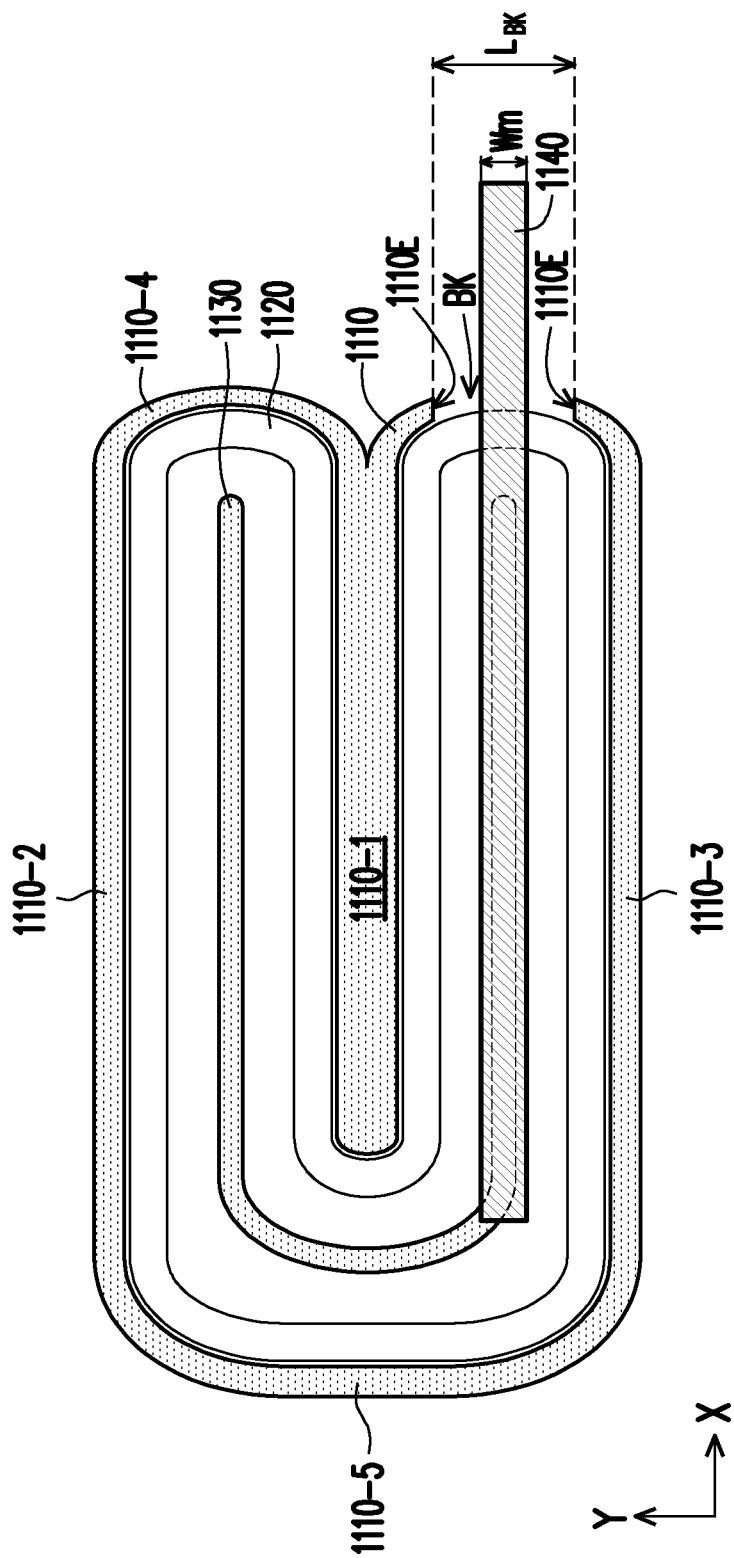
FIG. 11 is a schematic top view showing the relative positions and shapes of the doped ring regions and the gate structure in accordance with embodiments of the disclosure.

FIG. 11 is a schematic top view of one exemplary embodiment showing the relative positions and shapes of the doped regions and the gate structure in accordance with some embodiments of the disclosure.

From the top view of FIG. 11, the source region 1110 includes portions 1110-1 and 1110-2 extending in the X-direction connected through a portion 1110-4 extending in the Y-direction and the X-extending portions 110-2 and 1110-3 connected through a Y-extending portion 1110-5. From the schematic top view, the source region 1110 is shaped like a folded loop with portion 1110-1 folded and extended inwardly, and there is a break BK located between both ends 1110E (between the end 1110E of the portion 1110-1 and the end 1110E of the portion 1110-3). That is, the source region 1110 is a doped region shaped like two joined fingers. In some embodiments, the gate structure 1120 is arranged next to the source region 1110 and is also shaped like a folded loop or like two joined fingers. From the top view, the gate structure 1120 is a continuous structure without a break. In FIG. 11, the drain region 1130 is enclosed by the gate structure 1120 and the source region 1110 and is shaped like a "C" or a hair pin. In some embodiments, the drain region 1130 is spaced apart from the gate structure 1120 and apart from the source region 1110. In FIG. 11, the HVI trace 1140 is located above and overlaps a portion of the drain region 1130 and extends over and along the drain region 1130 in the X-direction, across the gate structure 1120 and the break BK and beyond or outside the gate structure 1120 and the source region 1110. As the HVI trace 1140 crosses over the gate structure 1120 and the source region 1110, the location of the break BK is located below the crossing location of the HVI trace 1140 crossing over the source region 1110. From the top view of FIG. 11, the extending length $L_{BK}$ of the break BK is larger than the width Wm of the HVI trace 1140.

In the above embodiments, the configuration of the source region of the transistor structure is designed to be have a break or gap in a continuous path at the location under the HVI metal line or trace, so that the continuous path is interrupted and the hot carrier path is interrupted due to the existence of the break or gap. As the hot carrier effect is minimized, the gate oxide layer (or gate dielectric layer) next to the break and under the HVI metal line will not be damaged. Through such configuration, the HBM protection level is increased a few times and significantly improved, and the HBM endurance deviation is reduced by 78%.

In accordance with some embodiments, a semiconductor device includes a drain region and a source region in a substrate, a gate structure and a metallic line. The source region surrounds the drain region in the substrate. The gate structure is disposed on the substrate, and disposed between the source region and the drain region. The gate structure surrounds the drain region. The metallic line is located above the source and drain regions and the gate structure and electrically connected to the drain region or the source region. The source region includes a doped region having a break region located between two opposite ends of the doped region. The metallic line extends from the drain region, across the gate structure and across the break region and beyond the source region.

In accordance with some embodiments, a semiconductor device includes a substrate having a first conductive type doped well in the substrate, a second conductive type doped well in the first conductive type doped well and isolation structures thereon defining a first region and a second region of the substrate. A first conductive type doped drain region is located within the first conductive type doped well and located in the first region of the substrate. A first conductive type doped source region is located within the second conductive type doped well and in the second region of the substrate and surrounds the first conductive type doped drain region. A gate structure is disposed partially on the substrate and partially on one of the isolation structures. The gate structure is disposed between the first conductive type doped source region and the first conductive type doped drain region and the first conductive type doped source region surrounds the gate structure. A channel region is located under the gate structure and within the second conductive type doped well. A metallic line is located above the first conductive type doped source and drain regions and the gate structure. The metallic line is electrically connected to the first conductive type doped drain region. The first conductive type doped source region has a split loop-shaped top view divided by a break region. The metallic line extends across the gate structure and across the break region and beyond the first conductive type doped source region.

In accordance with some embodiments, a method of manufacturing a semiconductor device includes at least the following steps. A first conductive type doped well is formed in the substrate. A second conductive type doped well is formed in the first conductive type doped well in the substrate. Isolation structures are formed on the substrate to define a first region and a second region of the substrate. A gate structure and conductive semiconductor patterns are formed on the isolation structures and on the substrate. First conductive type doped regions and second conductive type doped regions are formed in the first and second regions of the substrate. At least one metallic line is formed above and across the gate structure. The at least one metallic line extends across the first conductive type doped region and the second conductive type doped region in the second region and is electrically connected with at least one of the first conductive type doped regions and second conductive type doped regions.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor device, comprising:
    a drain region in a substrate;
    a source region in the substrate, completely surrounding the drain region;
    a gate structure, disposed on the substrate, disposed between the source region and the drain region and surrounding the drain region; and
    a metallic line, located above the source and drain regions and the gate structure and electrically connected to the drain region or the source region,
    wherein the source region includes a doped region having a break region located between two opposite ends of the doped region, and
    wherein the metallic line extends from the drain region, across the gate structure and across the break region and beyond the source region.

2. The semiconductor device of claim 1, wherein the source region has a top view of a C-shaped ring.

3. The semiconductor device of claim 1, wherein a vertical projection of the metallic line falls within and is overlapped with a span of the break region.

4. The semiconductor device of claim 3, wherein the two opposite ends of the doped region are spaced from the vertical projection of the metallic line with a first spacing and a second spacing respectively, and the first spacing is the same as the second spacing.

5. The semiconductor device of claim 3, wherein the two opposite ends of the doped region are spaced from the vertical projection of the metallic line with a first spacing and a second spacing respectively, and the first spacing is different from the second spacing.

6. The semiconductor device of claim 1, further comprising an isolation structure on the substrate and located between the source and drain regions, and the gate structure is disposed partially on the substrate and partially on the isolation structure.

7. The semiconductor device of claim 6, further comprising a doped body well located below the source region and the gate structure, and a channel region located below the gate structure and within the doped body well.

8. A semiconductor device, comprising:
    a substrate having a first conductive type doped well in the substrate, a second conductive type doped well in the first conductive type doped well and isolation structures thereon defining a first region and a second region of the substrate;
    a first conductive type doped drain region, located within the first conductive type doped well and located in the first region of the substrate;
    a first conductive type doped source region, located within the second conductive type doped well and in the second region of the substrate, and completely surrounding the first conductive type doped drain region;
    a gate structure, disposed partially on the substrate and partially on one of the isolation structures, wherein the gate structure is disposed between the first conductive type doped source region and the first conductive type doped drain region, and the first conductive type doped source region surrounds the gate structure;
    a channel region located under the gate structure and within the second conductive type doped well; and
    a metallic line, located above the first conductive type doped source and drain regions and the gate structure, wherein the metallic line is electrically connected to the first conductive type doped drain region,
    wherein the first conductive type doped source region has a split loop-shaped top view divided by a break region, and wherein the metallic line extends across the gate structure and across the break region and beyond the first conductive type doped source region.

9. The semiconductor device of claim 8, wherein an extending length of the break region is larger than a width of the metallic line at an intersecting location of the metallic line across the first conductive type doped source region.

10. The semiconductor device of claim 9, wherein the extending length of the break region ranges from about 0.2 microns to about 70 microns.

11. The semiconductor device of claim 8, wherein the first conductive type is N-type, and the second conductive type is P-type.

12. The semiconductor device of claim 8, wherein the first conductive type is P-type, and the second conductive type is N-type.

13. The semiconductor device of claim 8, wherein the first conductive type doped well has a doping concentration lower than those of the first conductive type doped drain region and the first conductive type doped source region.

14. The semiconductor device of claim 8, further comprising a second conductive type doped well located in the first region of the substrate and surrounding the first conductive type doped drain region.

15. The semiconductor device of claim 8, further comprising a second conductive type doped region located in the second region of the substrate and surrounding the first conductive type doped source region.

16. The semiconductor device of claim 15, wherein the second conductive type doped region has a closed loop shaped top view.

17. A method of manufacturing a semiconductor device, comprising:
    forming a first conductive type doped well in the substrate;
    forming a second conductive type doped well in the first conductive type doped well in the substrate;
    forming isolation structures on the substrate to define a first region and a second region of the substrate;
    forming a gate structure and conductive semiconductor patterns on the isolation structures and on the substrate;
    forming first conductive type doped regions and second conductive type doped regions in the first and second regions of the substrate, wherein forming the first conductive type doped regions in the first and second regions of the substrate comprises forming a first conductive type doped drain region in the first region and forming a first conductive type doped source region in the second region, and the first conductive type doped source region completely surrounds the first conductive type doped drain region; and
    forming at least one metallic line above and across the gate structure, wherein the at least one metallic line extends across the first conductive type doped region and the second conductive type doped region in the second region and is electrically connected with at least one of the first conductive type doped regions and second conductive type doped regions.

18. The method of claim 17, wherein forming first conductive type doped regions and second conductive type doped regions in the first and second regions of the substrate comprises forming the first conductive type doped regions in the first and second regions of the substrate by performing a first ion implantation process, and later forming the second conductive type doped regions in the first and second regions of the substrate by performing a second ion implantation process, and the first ion implantation process is different from the second ion implantation processes.

19. The method of claim 18, wherein the first conductive type doped source and drain regions are formed in the same implantation process.

20. The method of claim 19, wherein forming a first conductive type doped source region in the second region includes implanting first conductive type of dopants into the substrate to form a split ring-shaped region with a break where no first conductive type of dopant is implanted.

* * * * *